United States Patent [19]

Barden

[11] Patent Number: 4,760,034
[45] Date of Patent: Jul. 26, 1988

[54] METHOD OF FORMING EDGE-SEALED MULTI-LAYER STRUCTURE WHILE PROTECTING ADJACENT REGION BY SCREEN OXIDE LAYER

[75] Inventor: John M. Barden, Albuquerque, N. Mex.

[73] Assignee: Motorola, Inc., Schaumburg, Ill.

[21] Appl. No.: 61,639

[22] Filed: Jun. 15, 1987

[51] Int. Cl.$^4$ .............. H01L 21/94; H01L 21/22; H01L 29/78
[52] U.S. Cl. ............................. 437/047; 357/24; 357/45; 357/91; 437/59; 437/60; 148/DIG. 82
[58] Field of Search ............... 437/47, 59, 60; 357/24, 357/45, 91

[56] References Cited

U.S. PATENT DOCUMENTS

| | | | |
|---|---|---|---|
| 4,295,264 | 10/1981 | Rogers | 437/47 |
| 4,350,536 | 9/1982 | Nakano et al. | 437/47 |
| 4,391,032 | 7/1983 | Schulte | 437/47 |
| 4,422,885 | 12/1983 | Brower et al. | 437/45 |
| 4,466,177 | 8/1984 | Chao | 437/45 |
| 4,536,947 | 8/1985 | Bohr et al. | 437/60 |
| 4,603,059 | 7/1986 | Kiyosomi et al. | 437/81 |

Primary Examiner—Upendra Roy
Attorney, Agent, or Firm—John A. Fisher; Jeffery Van Myers; David L. Mossman

[57] ABSTRACT

A process for forming a DRAM cell having a capacitor adjacent a field effect transistor (FET), wherein the FET fabrication area is protected from adverse effects of the capacitor formation. The process is misalignment tolerant and provides FETs with appreciably lower defects in the substrate beneath the FET. Additionally, the process eliminates the need to stop an etching operation on a thin capacitor dielectric layer.

18 Claims, 6 Drawing Sheets

METHOD OF FORMING EDGE-SEALED MULTI-LAYER STRUCTURE WHILE PROTECTING ADJACENT REGION BY SCREEN OXIDE LAYER

FIELD OF THE INVENTION

The invention relates to methods for fabricating integrated circuits, and more particularly relates to methods for fabricating capacitors and field effect transistors (FETs) adjacent to one other wherein the processing of one device may affect the quality and structure of an adjacent, but different type of device.

BACKGROUND OF THE INVENTION

During the process flow of making state of the art DRAMs, a thin capacitor dielectric consisting of silicon dioxide and silicon nitride is typically formed. After patterning the polycrystalline silicon (polysilicon) plate of the planar capacitor, the remaining regions of the capacitor dielectric are stripped off. The polysilicon plate is then covered by an insulating or dielectric layer and the transistor gate dielectric, such as silicon dioxide, is grown. The present problems in current methods concern removing the capacitor dielectric and any nitrogen that may have diffused to the silicon surface, without damaging the monocrystalline silicon. If any nitrogen is left in the silicon, or if the silicon is damaged by the etch in the effort to remove the capacitor dielectric, then the gate dielectric, e.g. silicon dioxide, will be degraded and the performance of the adjacent transistor will be compromised.

Another difficulty with forming FETs adjacent capacitors concerns overetching. Typically, the top plate of a planar MOS capacitor is doped polysilicon. The etch of this polysilicon layer traditionally has been stopped at the thin dielectric layer of the capacitor underlying the polysilicon layer, but because the dielectric layer is so thin, often the process would etch through both the dielectric layer and part of the underlying silicon substrate, damaging the future FET fabrication area. Ideally, an improved fabrication process would avoid this problem.

The use of capacitors adjacent a transistor forms a one-transistor memory storage cell for a dynamic random access memory (DRAM), a particular high-volume type of semiconductor memory. However, capacitors adjacent FETs also occur in many other types of semiconductor integrated circuits.

U.S. Pat. No. 4,466,177 to Chao discloses a prior art process for the fabrication of capacitors adjacent to transistors where the capacitor dielectric and the transistor gate dielectric layers are separately grown. It is noted that the method of U.S. Pat. No. 4,466,177 is applicable only to single polysilicon processes only. Further, the substrate in the 4,466,177 process is also undesirably exposed to etching, handling and cleaning effects. Another of the problems with using the method of U.S. Pat. No. 4,466,177 to provide separately tailored dielectric layers for the capacitors and the FETs is that inadequate protection is provided to prevent nitrogen from diffusing to the silicon surface of the FET fabrication areas. It would be advantageous to discover a process by which the substrate surface was kept protected until just prior to forming the capacitor dielectric or the FET gate oxide.

One approach to solving the problem of a damaged substrate in the area where FETs are to be formed is to form, preferably by growing, a sacrificial oxide layer which is etched off just prior to the formation of the FET gate oxide.

Additionally, for background information, U.S. Pat. No. 4,603,059 teaches an alternate prior art method for making capacitors adjacent FETs where the capacitor dielectric is a three-ply dielectric layer of a first silicon oxide film, a nitride film, and a second oxide film.

Thus, it would be an advance in the integrated circuit fabrication art if a method were discovered for fabricating planar capacitors and FETs adjacent each other, wherein the capacitor dielectric may be etched without damaging the semiconductor substrate where the FET is to be formed. Preferably, such a method would also inhibit the diffusion of nitrogen into the FET fabrication area as well.

SUMMARY OF THE INVENTION

Accordingly, it is an object of the present invention to provide a process for making a capacitor adjacent a field effect transistor (FET), as in a one device memory cell of a DRAM, where the gate insulation or dielectric and storage capacitor insulation or dielectric can be individually tailored for their respective purposes.

Another object of the present invention is to provide a method for fabricating a capacitor adjacent to a FET, where the FET fabrication areas of the substrate are protected from physical damage during the capacitor fabrication, particularly during the etch steps.

It is another object of the invention to provide a process by which the substrate surface was kept protected until just prior to forming the capacitor dielectric or the FET gate oxide.

It is still another object of the present invention is to provide a method for fabricating a capacitor adjacent to a FET, where the FET fabrication areas of the substrate are also protected from the diffusion of nitrogen and other contaminants, such as tantalum from $Ta_2O_3$ (tantalum oxide), during the capacitor fabrication. Contamination is a particular concern in processes where a three-ply capacitor, such as an ONO capacitor, is employed.

Yet another object of the present invention is to provide a technique for fabricating a capacitor adjacent to a FET where there is tolerance for the misalignment of the masks used for etching the features of the capacitor relative to the FET fabrication area.

It is an additional object of the present invention to provide a misalignment-tolerant method for fabricating a capacitor adjacent a FET which maximizes the area of the cell capacitor for increased capacitance.

Still another object of the present invention is to provide a process for making a capacitor adjacent a FET, where the FET area is protected during capacitor fabrication, that may be easily integrated into a process that employs two layers of doped polysilicon.

In carrying out these and other objects of the invention, there is provided, in one form, a method for forming a first device adjacent a second device on a semiconductor substrate that prevents damage from occurring in the area of the substrate in which the second device is to be formed. The method first provides a layer of protective material over the semiconductor substrate. Next, a pattern of masking material is provided over portions of the semiconductor substrate selected as second device formation areas which leave exposed other portions of the substrate selected as first device formation areas. Then, the layer of protective material is removed from the first device formation areas of the semiconductor substrate, and the layer of masking material is removed from over the second device fabrication areas, leaving the layer of protective material over these areas of the substrate. Next, the first device is fabricated in the first device fabrication areas. Finally, the layer of protective material is removed from the second device fabrication areas just prior to the fabrication of second devices thereon.

BRIEF DESCRIPTION OF THE DRAWINGS

FIG. 2 is annealed to form a doped region in the substrate, which region is exposed after the removal of the unmasked portion of the pad oxide;

It should be noted that the cross-sectional illustrations employed herein are not to scale, particularly in that their vertical dimensions are greatly exaggerated relative to their lateral dimensions, in general, for clarity of illustration.

DETAILED DESCRIPTION OF THE INVENTION

Figure 1:
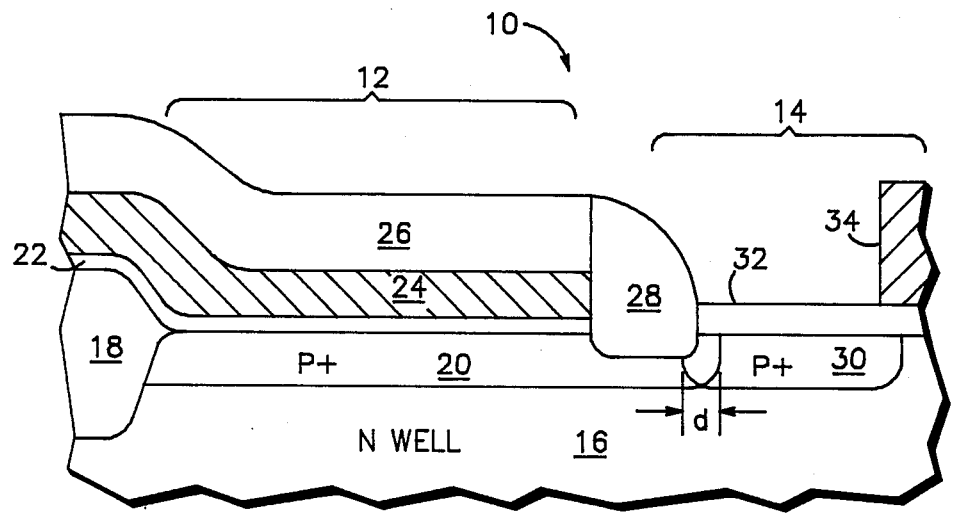
FIG. 1 is a cross-sectional illustration of an integrated circuit DRAM cell of this invention showing a completed capacitor and an adjacent FET under construction.

Shown in FIG. 1 is a cross-sectional, partial illustration of the capacitor/FET combination or DRAM memory cell 10 under construction, where the capacitor 12 is finished and the FET 14 is partly fabricated. The cell 10 rests within a substrate 16, which may be an epitaxial layer or a well, in this instance an n-well. Field oxide regions 18 are also provided at the periphery of cell 10.

While regions of certain conductivity types are referred to as "p-type" or "n-type", it will be readily appreciated that the teachings and benefits of this invention may be obtained if the conductivity types are reversed from those illustrated, and the invention is not limited to the use of a particular orientation or sequence of regions doped with a particular conductivity type.

Capacitor 12 comprises one plate 20 formed by a dopant diffused into the substrate 16 by one of the known methods, such as diffusion or implantation and anneal, a thin capacitor dielectric layer 22 over the plate 20, and a conductive material layer 24 over the thin capacitor dielectric layer 22 to form the other plate of the capacitor 12. The capacitor 12 is further insulated from the other elements of the integrated circuit by means of dielectric material layer 26 and edge sealing and insulating structure 28 which seals the edge of capacitor 12.

Field effect transistor 14 is partially constructed in FIG. 1 which shows a doped semiconductor source/drain region 30 beneath a gate dielectric layer 32 upon which a gate 34 of conductive material rests. Contacts and a passivation layer would be needed to complete FET 14. The source/drain region 30 is connected to the bottom plate 20 of capacitor 12 through the overlap measured at d. The distance d is not particularly critical and may vary, as the alignments of the masks to make capacitor 12 may vary. Thus, the cell 10 is somewhat misalignment tolerant. The structure of cell 10 is further unique in that the gate dielectric 32 and the substrate source/drain region 30 are not adversely affected by the etching required to form capacitor 12, nor by any nitrogen that may have been used in the formation of capacitor 12, such as in the formation of a silicon nitride layer.

The process of the present invention will now be explained with reference to FIGS. 2 through 11 which show the step-by-step construction of another embodiment of the present invention. Similar reference numbers will be used in the description of the fabrication process for ease in understanding, although in this particular embodiment, there are a few additional elements, some of which are optional.

Figure 2:
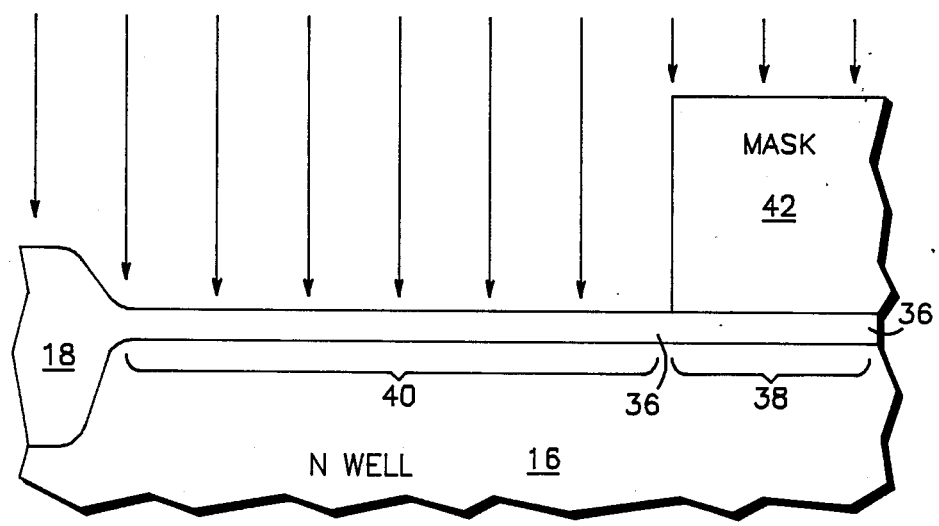
FIG. 2 is a cross-sectional illustration of another embodiment of the integrated circuit DRAM cell of the invention showing one of the first steps of its construction, namely the introduction of an impurity into a substrated that is masked on the side to be protected.
Figure 3:
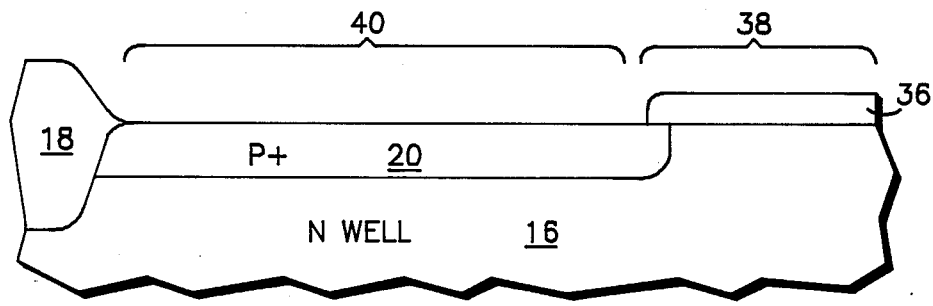
FIG. 3 is a further illustration of how the impurity used

Shown in FIG. 2 is a cross-sectional illustration of a DRAM memory cell 10 under construction in accordance with the method of the present invention, revealing the substrate 16, again an n-well, in which field oxide regions 18 have been formed by any of the conventional isolation fabrication techniques. A uniform layer of implantation protective material 36 is provided over the surface of the substrate 16. Layer of implantation protective material 36 would be typically, although is not limited to, silicon dioxide. Since the layer 36 serves the purpose of protecting the substrate 16 from physical damage due to the dopant ion bombardment illustrated in FIG. 2, as well as other protective purposes to be discussed later, it is often referred to as a pad or screen oxide. A typical thickness for the screen oxide may be about 200 Angstroms.

Conceptually, the substrate 16 may be thought of as having two areas: FET fabrication areas 38, wherein the FETs are to be fabricated, and capacitor fabrication areas 40, wherein the capacitors are to be fabricated. As shown in FIG. 2, the FET fabrication areas 38 are covered with a pattern of masking material 42, which may also be referred to as a capacitor implant mask, typically made from photoresist or other suitable material. Thus, the dopant ions implanted as schematically illustrated by the arrows in FIG. 2 are placed only in the substrate 16 in the capacitor fabrication areas 40, being masked elsewhere by the field oxide 18 and the implantation protective material 36.

With masking material pattern 42 in place, protective material layer 36 may be etched away from the capacitor fabrication area 40, after which the photoresist layer 42 may also be removed. The implanted dopant ions may be diffused in a separate anneal to form the doped semiconductor region 20 which serves as the bottom plate of the capacitor 12. These process steps give the structure shown in cross-sectional illustration FIG. 3.

Figure 4:
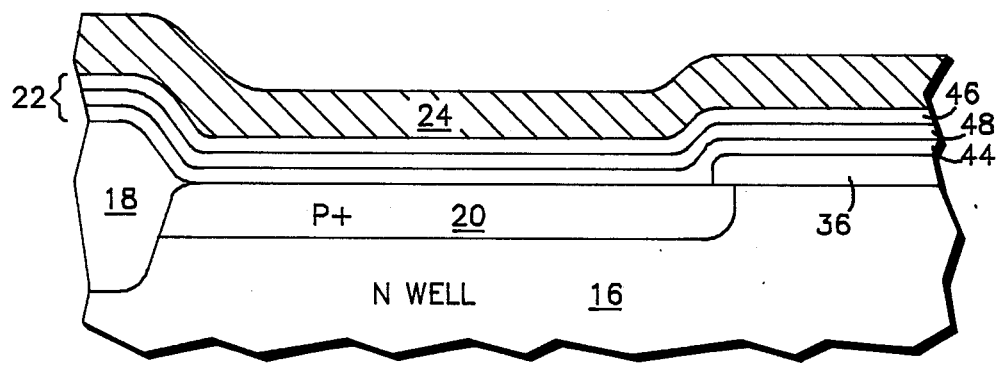
FIG. 4 is an illustration of the FIG. 3 structure after the capacitor dielectric and the capacitor conductive layer have been uniformly applied across the surface of the wafer.

Next, the capacitor dielectric layer 22 is introduced as a blanket layer over the substrate 16 as illustrated in FIG. 4. In the particular embodiment shown in FIG. 4, capacitor dielectric layer 22 is composed of a three-ply dielectric layer of two silicon dioxide layers 44 and 46 on either side of a silicon nitride layer 48. This dielectric structure is abbreviated as an "ONO layer" referring to oxide-nitride-oxide. Although each of the various layers of ONO layer 22 are shown as of equal thickness for the purposes of clear illustration, it is more typical that the nitride layer 48 is extremely thin, with the top oxide layer 46 being somewhat thinner than the nitride layer 48, and the bottom oxide layer 44 being the thickest of the three. The capacitor dielectric layer 22 is thinner as a whole than the gate oxide layer 32 of FET 14, as illustrated schematically in FIG. 1.

Also shown in FIG. 4 is a uniform layer of conductive material 24 on the capacitor dielectric layer 22. This conductive material layer 24 may be metal, a refractory metal silicide, a doped semiconductor material or a combination of these; for example, a titanium silicide on doped polycrystalline silicon, sometimes called a polycide. This layer 24 will eventually form the top plate of capacitor 12.

Figure 5:
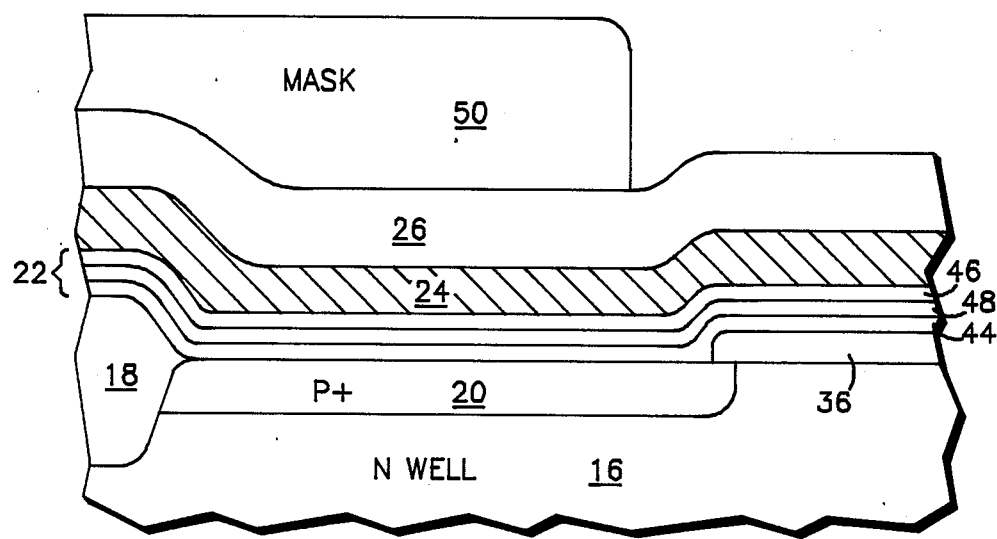
FIG. 5 is an illustration of the FIG. 4 structure where a blanket dielectric layer and a masking pattern have been applied.
Figure 6:
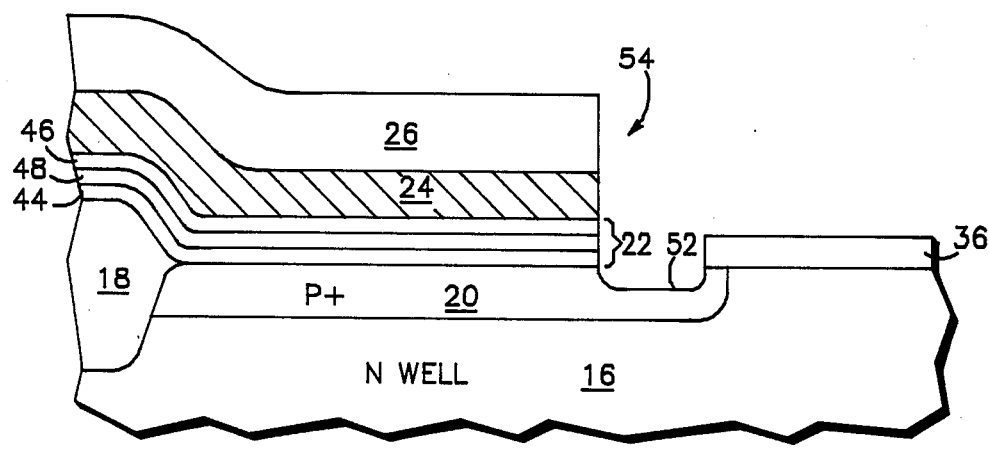
FIG. 6 is an illustration of the FIG. 5 structure after many of the layers are removed utilizing the mask of FIG. 5.

As shown in FIG. 5, another uniform layer 26, this time of a dielectric material is formed over the stack shown in FIG. 4. This material may be any suitable dielectric, such as silicon nitride, silicon dioxide, polycrystalline silicon/oxide (poly-oxide), low temperature oxide (LTO) or the like, to seal and insulate the top of the capacitor 10. It is expected that other techniques for insulating this conductive layer 24 from subsequent conductive layers could be used. Layers 22, 24 and 26 are next patterned by means of a mask 50, such as a photoresist mask, to give the structure shown in FIG. 6.

Layer 36 protects the FET areas 38 from being damaged during the etch of layers 22, 24 and 26. Just as importantly, layer 36 allows for sufficient overetch time, which would not be possible if only the thin ONO layer 22 alone was present. Also, with current etch processes, the endpoint detection signal for the oxide layer 36 is stronger.

It is one attribute of the invention that mask 50 may be slightly misaligned relative to mask 42 without the ultimate devices being too far out of alignment. The selective etch of the layers 22, 24, and 26 should be designed to stop on the last layer of implantation protective material 36, although some etching of the substrate 16 forming depression 52 may occur without disadvantage to the ultimate devices. The etch accomplished between FIGS. 5 and 6 forms a capacitor edge 54 revealing the exposed edge of layers 22, 24 and 26.

Figure 7:
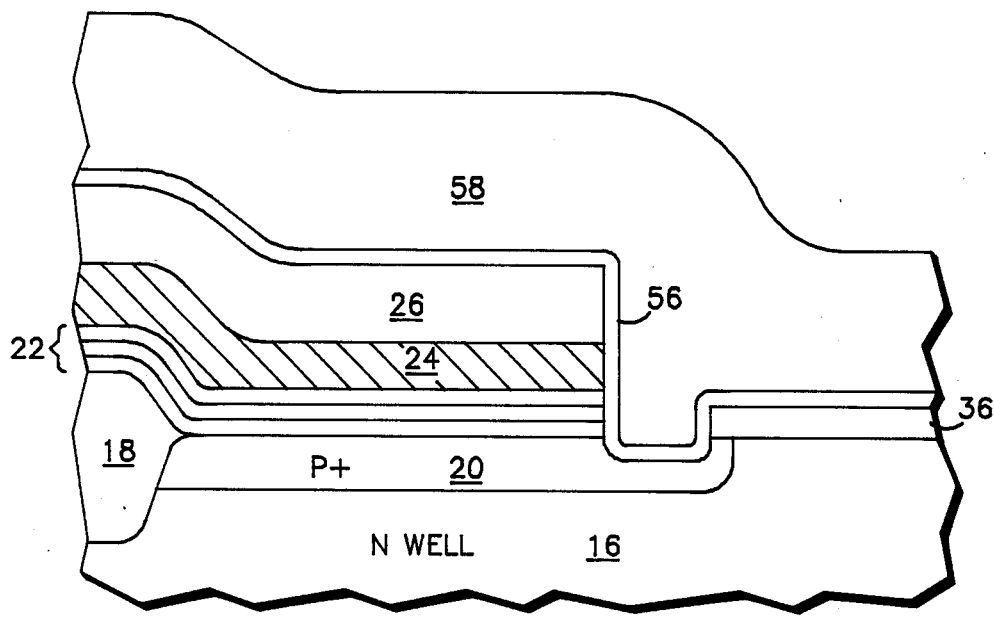
FIG. 7 is an illustration of the structure of FIG. 6 after two dielectric layers have been blanket applied to the surface of the semiconductor substrate.
Figure 8:
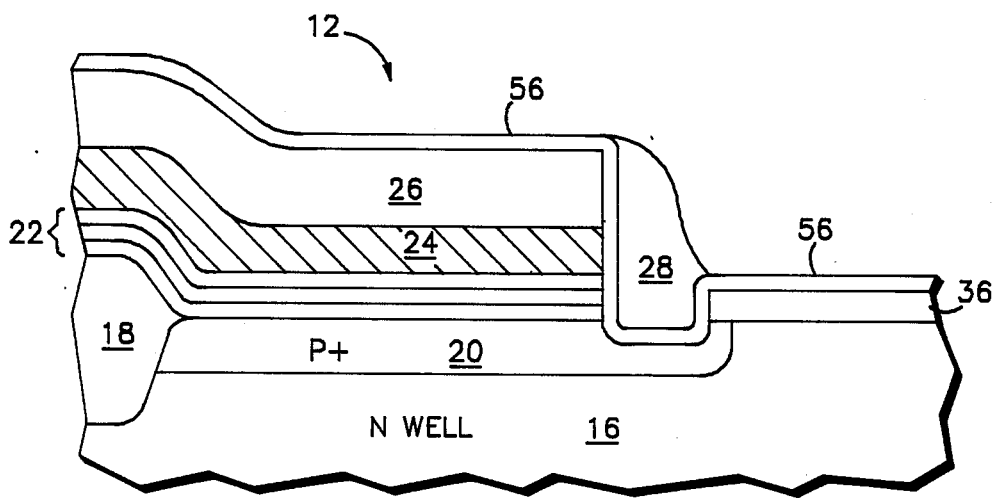
FIG. 8 is an illustration of a structure being made using the process of the present invention after a sidewall spacer is formed using the two dielectric layers applied as shown in FIG. 7.

The next concern is that the capacitor edge 54 must be insulated. One way of beginning to accomplish this is illustrated in FIG. 7, where it is shown that a thin, uniform capping layer of protective material 56 has been formed over the surface of the semiconductor substrate, including depression 52. That is, the material must be conformal. For the purposes of illustration herein, this layer is taken to be polysilicon, later to be converted to silicon dioxide. Or this layer could be of silicon dioxide from the start, as long as it was applied conformally. Next, a further edge sealing and insulating structure, which may be a sidewall spacer 28, is formed by laying down a thick dielectric material 58 and performing an anisotropic etch to give the structure shown in FIG. 8. The technique of forming sidewall spacers such as 28 is well known in the art. The material of layer 58 and edge sealing and insulating structure 28 may be any suitable dielectric material, such as low temperature oxide, which is conformal to the cross-sectional shape shown in FIG. 7.

Figure 9:
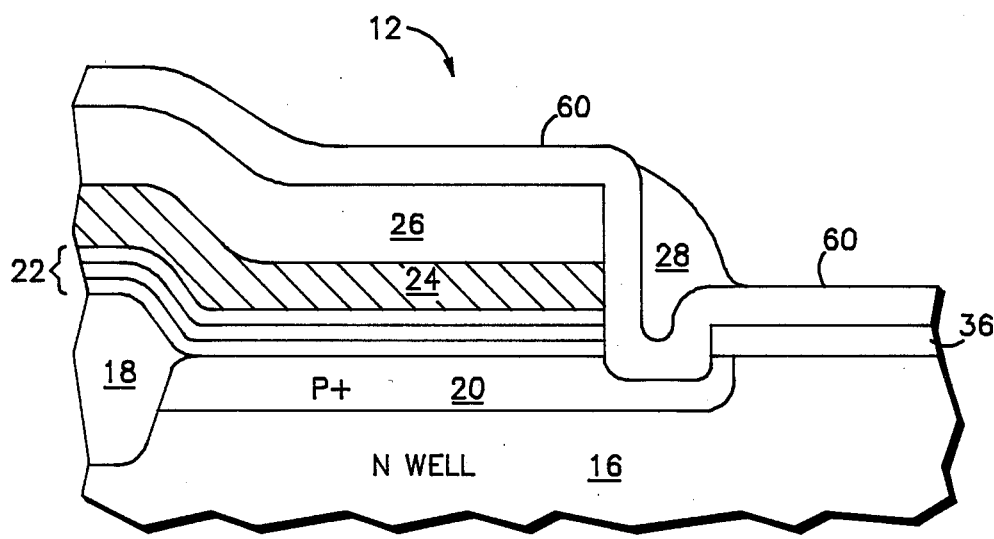
FIG. 9 is a cross-sectional illustration of the FIG. 8 structure after one of the dielectric layers formed as shown in FIG. 7 is oxidized.
Figure 10:
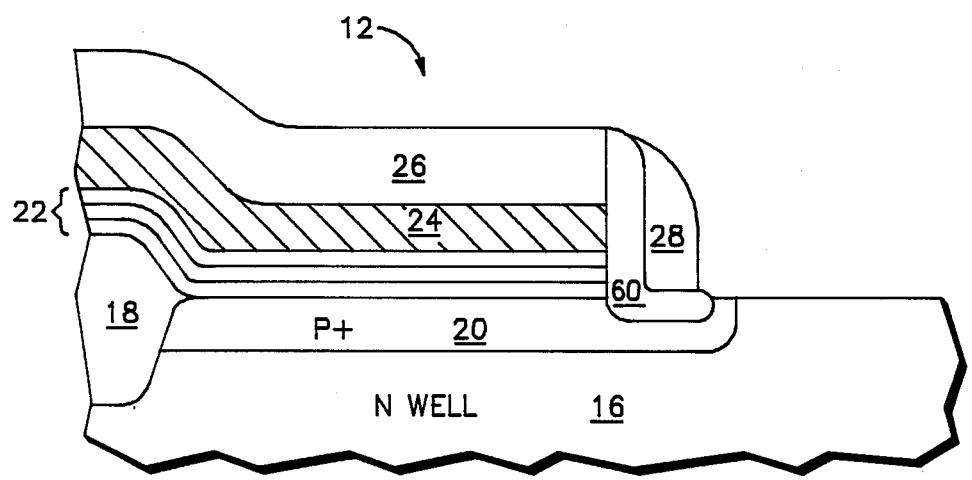
FIG. 10 is a cross-sectional illustration of the FIG. 9 structure after the removal of the protective material from the active region of the substrate that has been protected during the formation of an adjacent device, but which has been protected from any harmful effects from the adjacent device fabrication.

Next, the thin, uniform layer of protective material 56 may be oxidized to form a better seal. If the layer 56 is taken as polycrystalline silicon, the oxidation step turns the layer into thicker oxidized dielectric layer 60 as shown in FIG. 9. After an oxide etch, which can be isotropic or anisotropic, the structure shown in FIG. 10 is obtained which has a two-component sidewall. Note also that the remainder of the implantation protective material 36 is also removed in the etch occurring between FIG. 9 and 10, just prior to the FET gate 32 oxidation. Layer 36 has been protecting the FET fabrication areas 38 during construction of capacitor 12, including the prevention of physical damage and the diffusion of nitrogen, such as might occur during the formation of silicon nitride layer 48.

There are a number of other ways of sealing or insulating the edge 54 of layers 22, 24 and 26 with an edge sealing and insulating structure. For example, only sidewall spacer 28 could be used, and a structure such as that seen in FIG. 1 would result. Alternatively, looking at FIG. 6, protective layer 36 could be etched first and edge sealing structure 28 could be subsequently placed. Another possibility, looking at FIG. 5 would be to etch only layers 24 and 26 using mask 50, forming edge sealing structure 28 up against the edge 54 that would then be formed, and finally removing the remainder of layers 22 and 36. All of these techniques would be useful in the construction of the DRAM cell 10 of the invention.

Figure 11:
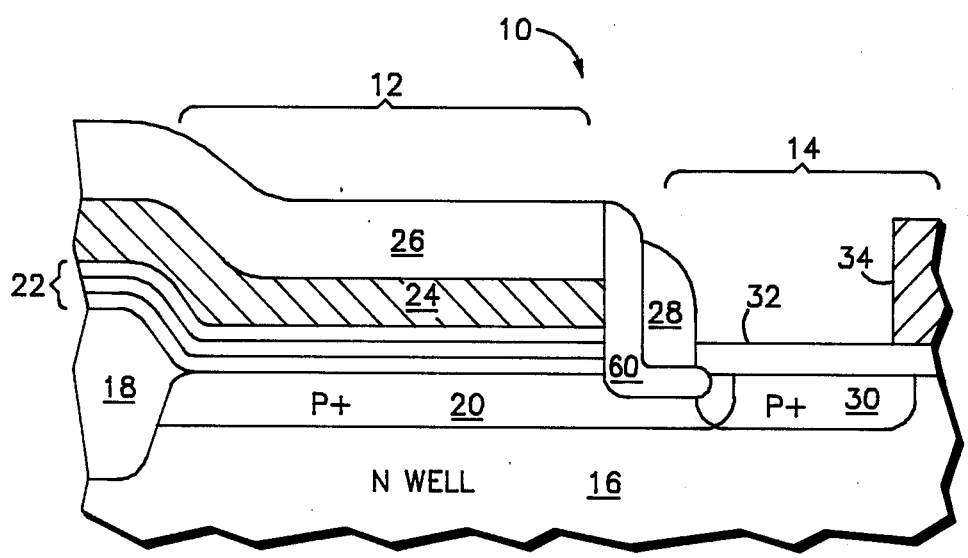
FIG. 11 is a cross-sectional illustration of the FIG. 11 structure after the adjacent device, here a FET, has been partially formed.

Shown in FIG. 11 is a partially complete FET 14 that might result after the capacitor 12 is finished as seen in FIG. 10. Typically, gate oxide layer 32 is formed, gate 34 of conductive material is patterned over the oxide layer 32, and source/drain region 30 is formed by some means, such as ion implantation through the gate oxide 32.

The particular method of fabricating the FET 14 is not important for the method or structure of the invention, except that the surface of the substrate 16 under the FET 14 is of exceptional quality, being protected from the adverse effects of capacitor 12 construction, at least by screen or pad oxide 36. This thin screen oxide 36 minimizes or prevents nitrogen and other substances from the capacitor dielectric, e.g. ONO layer 22, and other structures from diffusing to the silicon surface in the areas where the gate oxide 32 will be grown. The implantation protective material 36 also provides protection from the damaging effects of the capacitor polysilicon plate 24 etch, which can normally etch through the very thin capacitor dielectric 22 to the substrate 16 surface. Protection is also present during the process by which the conductive layer 24 sealing or insulating takes place; a process which may contain damaging oxidations, etches and depositions, depending on the process. Additionally, the worst case of misalignment of the top capacitor plate 24 dominates the loss of capacitor area from misalignment, whereas simply using the capacitor implant mask 42 for this purpose does not. Further, etching off the thin oxide 36 in the capacitor fabrication areas 40 after FIG. 2 using the capacitor implant mask 42 in place increases the area of the cell capacitor by etching back the field oxide bird's beak structure. Finally, the substrate 16 surface under the FET gate 34 area is also protected from the ONO dielectric 22 etch, whether it be dry or wet.

Some experiments using a prototype Screen Oxide Aided Protection of Substrate (SOAPS) process of the instant invention demonstrated that defects in the FETs fabricated adjacent capacitors could be significantly reduced, as shown by the following data. In these experiments, substrate surfaces treated in different ways were used to fabricate large capacitors to evaluate the quality of the FET gate oxide grown on the substrates. Table 1 compares three capacitors formed on three different types of surfaces: a control group of capacitors formed on bare silicon wafers with no processing until the FET gate oxidation, capacitors formed on a surface from which an ONO layer was removed by a standard wet etch and capacitors formed on a surface protected by a screen oxide layer such as 36 from the standard wet etch removal of an ONO layer. The wafers in the last, SOAPS group were processed to duplicate the effects of DRAM capacitor formation upon FET fabrication areas 38 as described above. The last steps in all three groups were growing the FET gate oxide 32, depositing the polysilicon 34 and patterning the polysilicon to form large capacitors. The data presented was generated from these capacitors. The numbers provided were the number of defects found with the electric field strength of 6 MV/cm applied. A measure of 1.0 defects/cm$^2$ at 6 MV/cm means that within a 1 cm$^2$ square, there was one place where the gate oxide allowed more than 1 microamp to flow between the polysilicon gate and the silicon substrate, where 1 microamp/cm$^2$ is the current density. Defects as low as 0.9/cm$^2$ and 0.5/cm$^2$ have been achieved when the substrate is protected as in the process of the present invention.

TABLE 1

| Quality of 250 Angstrom FET Gate Oxide | | |
|---|---|---|
| | Defects/cm$^2$ Area | Defects/cm Edge |
| Control (surface exposed only to handling prior to gate) | 4.4 | 8.1 |
| No screen oxide protection prior to wet etch of ONO | 10.9 | 204 |
| Screen oxide protection (SOAPS) prior to wet etch of ONO | 1.6 | 3.9 |

It can be understood that the number of defects can be reduced appreciably when the substrate surface is protected with a screen oxide.

I claim:

1. A method for forming a first device adjacent a second device on a semiconductor substrate so as to prevent damage from occurring in the area of the substrate where the second device is to be formed, comprising:
   providing a layer of protective material over the semiconductor substrate;
   providing a masking material on the protective material layer over a selected portion of the semiconductor substrate comprising a second device formation area, leaving exposed the protective material layer over an adjacent portion of the substrate comprising a first device formation area;
   removing the layer of protective material from the first device formation area of the semiconductor substrate;
   removing the layer of masking material from over the second device fabrication areas, leaving the layer of protective material over this area of the substrate;
   fabricating said first device in the first device fabrication areas, while the second device fabrication areas are protected by the layer of protective material by:
     forming a first uniform layer of dielectric material over the semiconductor substrate;
     forming a uniform layer of conductive material over the uniform layer of dielectric material;
     forming a second uniform layer of dielectric material over the uniform layer of conductive material;
     selectively removing the layers of first dielectric material, conductive material and second dielectric material from at least the second device formation area, to form an edge of the layers of first and second dielectric material and conductive material; and
     insulating the edge of the layers of first and second dielectric material and conductive material; and
   removing the layer of protective material from over the second device fabrication area.

2. The method of claim 1 wherein the layer of protective material is removed from over the second device fabrication area just prior to the fabrication of second devices thereon.

3. The method of claim 1 wherein the first device is a capacitor and the second device is a field effect transistor (FET).

4. A misalignment-tolerant method for forming a capacitor adjacent a field effect transistor (FET) on a semiconductor substrate so as to prevent damage from occurring in the area of the substrate where the FET is to be formed, comprising:
   providing a layer of implantation protective material over the semiconductor substrate;
   providing a masking material on the protective material layer over a selected portion of the semiconductor substrate comprising a FET fabrication area, leaving exposed the protective material layer over an adjacent portion of the substrate comprising a capacitor formation area;
   introducing a dopant into the capacitor formation area of the semiconductor substrate, to form a doped region comprising a lower plate of the capacitor;
   removing the layer of implantation protective material from the capacitor formation area of the semiconductor substrate;
   removing the layer of masking material from over the FET fabrication area, leaving the layer of implantation protective material over this area of the substrate;
   fabricating said capacitor in the capacitor formation area, while the FET fabrication area is protected by the layer of protective material, by:

forming a uniform layer of capacitor dielectric material over the semiconductor substrate;

forming a uniform layer of conductive material over the uniform layer of capacitor dielectric material;

forming a uniform layer of dielectric material over the uniform layer of conductive material;

selectively removing the layers of capacitor dielectric material, conductive material and dielectric material from at least the FET fabrication area of the semiconductor substrate, to form a capacitor edge of the layers of capacitor dielectric material, conductive material and dielectric material; and insulating the capacitor edge of the layers of capacitor dielectric material, conductive material and dielectric material; and removing the layer of implantation protective material from the FET fabrication area, which have been protected thereby.

5. The method of claim 4 wherein a uniform thin dielectric capping layer is provided after the layers of capacitor dielectric material, conductive material and dielectric material are etched and prior to the sidewall spacer formation; wherein the uniform thin dielectric capping layer laid over the implantation protective material on the FET fabrication areas is removed therewith.

6. The method of claim 4 wherein the selective removal of the layers of capacitor dielectric material, conductive material and dielectric material is accomplished by means of a subsequent pattern of masking material.

7. The method of claim 4 wherein the pattern of masking material and the subsequent pattern of masking material may be misaligned with respect to one another.

8. The method of claim 4 wherein the capacitor dielectric material layer comprises a plurality of thin dielectric layers.

9. The method of claim 8 wherein the capacitor dielectric material layer comprises a silicon dioxide, silicon nitride and silicon dioxide (ONO) sandwich.

10. The method of claim 9 wherein the semiconductor substrate is monocrystalline silicon; the layer of implantation protective material and the layers of dielectric material are selected from the group consisting of silicon dioxide, silicon nitride and mixtures thereof; and the layer of conductive material layer is selected from the group consisting of doped polycrystalline silicons, metals, refractory metal silicides and mixtures thereof.

11. A misalignment-tolerant method for forming a capacitor adjacent a field effect transistor (FET) on a semiconductor substrate so as to prevent damage from occurring in the area of the substrate in which the FET is to be formed, comprising:

providing a layer of implantation protective material over the semiconductor substrate; providing a masking material on the protective material layer over a selected portion of the semiconductor substrate comprising a FET fabrication area, leaving exposed the protective material over an adjacent portion of the substrate comprising a capacitor formation area;

implanting a dopant into the capacitor formation area of the semiconductor substrate through the layer of implantation protective material, to form a doped region comprising a lower plate of the capacitor;

removing the layer of implantation protective material from the capacitor formation area of the semiconductor substrate;

removing the layer of masking material from over the FET fabrication area, leaving the layer of implantation protective material over this area of the substrate;

fabricating said capacitor in the capacitor formation area, while the FET fabrication area is protected by the layer of protective material, by:

forming a uniform layer of capacitor dielectric material over the semiconductor substrate;

forming a uniform layer of conductive material over the uniform layer of capacitor dielectric material;

forming a uniform layer of dielectric material over the uniform layer of conductive material;

selectively removing the layer of capacitor dielectric material, conductive material and dielectric material from at least the FET fabrication area of the semiconductor substrate, to form a capacitor edge of the layers of capacitor dielectric material, conductive material and dielectric material; and forming a sidewall spacer of dielectric material on the capacitor edge of the layers of capacitor dielectric material, conductive material and dielectric material; and removing the layer of implantation protective material from the FET fabrication area, which have been protected thereby, in preparation for forming a FET.

12. The method of claim 11 wherein a uniform thin dielectric capping layer is provided after the layers of capacitor dielectric material, conductive material and dielectric material are etched and prior to the sidewall spacer formation; wherein the uniform thin dielectric capping layer laid over the implantation protective material on the FET fabrication area is removed therewith.

13. The method of claim 11 wherein the selective removal of the layers of capacitor dielectric material, conductive material and dielectric material is accomplished by means of a subsequent pattern of masking material.

14. The method of claim 11 wherein the pattern of masking material and the subsequent pattern of masking material may be misaligned with respect to one another.

15. The method of claim 11 wherein the capacitor dielectric material layer comprises a plurality of thin dielectric layers.

16. The method of claim 15 wherein the capacitor dielectric material layer comprises a silicon dioxide, silicon nitride and silicon dioxide (ONO) sandwich.

17. The method of claim 16 wherein the semiconductor substrate is monocrystalline silicon; the layer of implantation protective material, the sidewall spacer and the layers of dielectric material are selected from the group consisting of silicon dioxide, silicon nitride and mixtures thereof; and the layer of conductive material layer is selected from the group consisting of doped polycrystalline silicons, metals, refractory metal silicides and mixtures thereof.

18. A misalignment-tolerant method for forming a capacitor adjacent a field effect transistor (FET) on a semiconductor substrate so as to prevent damage from occurring in the area of the substrate in which the FET is to be formed, comprising:

providing a layer of implantation protective material over the semiconductor substrate;

providing a first pattern of masking material on the protective material layer over a selected portion of the semiconductor substrate comprising a FET fabrication area and leaving exposed the protective material over an adjacent portion of the substrate comprising a capacitor formation area;

implanting a dopant into the capacitor formation area of the semiconductor substrate through the layer of implantation protective material, to form a doped region comprising a lower plate of the capacitor;

removing the layer of implantation protective material from the capacitor formation area of the semiconductor substrate;

removing the first layer of masking material from over the FET fabrication area, leaving the layer of implantation protective layer over this area of the substrate;

fabricating said capacitor in the capacitor formation area, while the FET fabrication area is protected by the layer of protective material, by:

forming a uniform layer of capacitor dielectric material over the semiconductor substrate;

forming a uniform layer of conductive material over the uniform layer of capacitor dielectric materal;

forming a uniform layer of dielectric material over the uniform layer of conductive material;

providing a second pattern of masking material over the capacitor formation areas, wherein the second pattern of masking material may be misaligned with respect to the first pattern of masking material;

selectively removing the layers of capacitor dielectric material, conductive material and dielectric material from at least the FET fabrication area of the semiconductor substrate, to form a capacitor edge of the layers of capacitor dielectric material, conductive material and dielectric material; and forming a sidewall spacer of dielectric material on the capacitor edge of the layers of capacitor dielectric material, conductive material and dielectric material; and removing the layer of implantation protective material from the FET fabrication area, which have been protected thereby, in preparation for forming a FET.

* * * * *